United States Patent [19]

Mukherjee

[11] Patent Number: 5,034,790
[45] Date of Patent: Jul. 23, 1991

[54] MOS TRANSISTOR WITH SEMI-INSULATING FIELD PLATE AND SURFACE-ADJOINING TOP LAYER

[75] Inventor: Satyendranath Mukherjee, Yorktown Hts., N.Y.

[73] Assignee: U.S. Philips Corp., New York, N.Y.

[21] Appl. No.: 561,226

[22] Filed: Aug. 1, 1990

Related U.S. Application Data

[63] Continuation of Ser. No. 356,043, May 23, 1989.

[51] Int. Cl.$^5$ ................ H01C 29/68; H01C 29/10; H01C 29/34
[52] U.S. Cl. ................ 357/23.8; 357/23.3; 357/23.4; 357/52
[58] Field of Search ............ 357/23.4, 23.8, 23.3, 357/52

[56] References Cited

U.S. PATENT DOCUMENTS

| | | | |
|---|---|---|---|
| 4,300,150 | 11/1981 | Colak | 357/23.8 |
| 4,831,423 | 5/1989 | Shannon | 357/23.8 |
| 4,866,495 | 9/1989 | Kinzen | 357/23.4 |

Primary Examiner—Rolf Hille
Assistant Examiner—Wael Fahmy
Attorney, Agent, or Firm—Steven R. Biren

[57] ABSTRACT

A lateral MOS transistor includes a semi-insulating field plate adjacent the surface of the device, over the drift region and extending laterally from the drain electrode toward the gate and source electrodes of the transistor. The field plate is connected at one end to the drain electrode, and at the other end to either the gate electrode of the source electrode. In order to improve the turn-on characteristics of the transistor, a surface-adjoining semiconductor top layer is provided in the drift region of the device, between the channel region and the drain region. This top layer is connected to the channel region at selected locations, and serves to improve device turn-on performance by causing a more rapid decrease in ON resistance at turn-on.

10 Claims, 3 Drawing Sheets

MOS TRANSISTOR WITH SEMI-INSULATING FIELD PLATE AND SURFACE-ADJOINING TOP LAYER

This is a continuation of application Ser. No. 356,043, filed May 23, 1989.

BACKGROUND OF THE INVENTION

The invention is in the field of metal-oxide-semiconductor (MOS) field-effect devices, and relates specifically to lateral MOS field-effect transistors of the type having a semi-insulating field plate over the drift region.

Such transistors are well-known in the art, and typical MOS field-effect transistors with a semi-insulating (i.e. very high resistivity) field plate over the drift region are shown in U.S. Pat. No. 4,270,137. Various other prior-art field-plate configurations are shown in U.S. Pat. Nos. 4,288,801; 4,495,513; 4,586,064; and 4,590,509. As noted in U.S. Pat. No. 4,270,137, field plates are incorporated into MOS field-effect transistors in order to achieve a high drain breakdown voltage while maintaining a relatively low steady-state ON resistance.

However, there is also a drawback associated with the use of a semi-insulating field-plate configuration as shown in the prior art devices. In the OFF state, the drift region is depleted, and a potential difference exists across the field plate. When the device is turned ON, the charge accumulated in the semi-insulating field plate cannot quickly dissipate, due to its high resistance, and the drift region surface is in a deep depletion condition, which collapses slowly due to either thermally-generated holes in the depletion region and/or discharge of the field plate. Since the discharge time for typical semi-insulating field plates is long, as is the time to thermally generate holes, the result is a high initial ON resistance which only slowly reaches its desirable low steady-state value. Typically, it will take on the order of several milliseconds or more to reach the low steady-state ON resistance value, thus severely limiting the practicality of this class of device for switching applications. A more detailed analysis of the steady-state and transient switching characteristics of field-plate devices is presented in THE EFFECTS OF SIPOS PASSIVATION ON DC AND SWITCHING PERFORMANCE OF HIGH VOLTAGE MOS TRANSISTORS, Mukhurjee et al, proceedings of the IEDM, December, 1986, pp. 646-649.

Accordingly, it would be desirable to overcome this transient ON resistance problem in semi-insulating field-plate devices, so that these devices, with their advantageous ON resistance and breakdown voltage characteristics, can be used in switching applications.

SUMMARY OF THE INVENTION

It is therefore an object of the present invention to provide an MOS transistor having a semi-insulating field plate in which the ON resistance drops rapidly to its low steady-state value upon turn-on.

In accordance with the invention this object is achieved by providing an MOS transistor having a semi-insulating field plate with a surface-adjoining top layer, of opposite conductivity type to that of the drift region, in the drift region and between the channel region and the drain region. This top layer is connected to the channel region of the device at selected locations.

The top layer may have a net charge doping of between about $1 \times 10^{12}$ and $3 \times 10^{12}$ cm$^{-2}$ and a thickness of between about 0.5 and 2.0 microns. Additionally, the top layer should preferably occupy at least 40% but less than 100% of the total lateral distance between the channel region and the drain region of the device. In a preferred embodiment, the top layer may occupy between about 80% and 98% of the lateral distance between the channel region and the drain region.

The top layer configuration of the present invention offers a significant structural improvement which substantially eliminates the problem of high initial ON resistance during device turn on, as switching times are reduced to tens of nano-seconds, which is comparable to the performance of conventional lateral MOS transistors. This improvement has been observed in devices fabricated in accordance with the invention.

It is believed that the substantial improvement in turn-on performance occurs because the top layer, which is connected to the channel region, provides a supply of holes when the device is turned ON, and also helps in the depletion process when the device is in the OFF state. When the top layer is provided, the potential drop across the surface of the device more closely tracks the potential drop across the semi-insulating field plate, so that net charge storage in the field plate is substantially reduced. Thus, even if this charge is drained off slowly, due to the high resistance of the semi-insulating field plate, its effect on the transient ON resistance of the device will be negligible.

Additional advantages of incorporating a top layer in accordance with the invention are that reliability of the resulting devices is improved due to the reduction of surface fields in the OFF state, and that devices incorporating the invention can be made physically smaller for a given application. Thus, the invention provides devices which are faster, smaller and more reliable than comparable prior-art devices.

BRIEF DESCRIPTION OF THE DRAWING

The invention will now be described in further detail with reference to several Figures of the drawing, in which.

It should be noted that the Figures are schematic in nature and are not drawn to scale.

DETAILED DESCRIPTION

Figure 1:
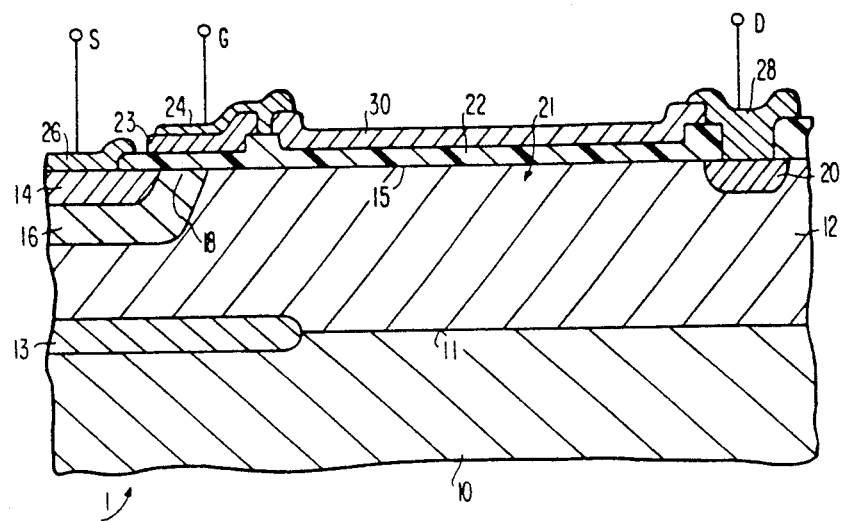
FIG. 1 is a cross-sectional view of a prior-art lateral MOS transistor having a semi-insulating field plate.

FIG. 1 of the drawing shows a typical prior art lateral MOS transistor of the type having a semi-insulating field plate adjacent the upper surface of the device. In FIG. 1 and the subsequent Figures of the drawing, like parts are designated with like reference numerals, and semiconductor regions of the same conductivity type are generally shown hatched in the same direction.

In FIG. 1, MOS transistor 1 has a semiconductor substrate 10, in this example of p-type semiconductor material having a typical doping concentration in the range of about $10^{13}-10^{15}$ cm$^{-3}$. An epitaxial layer 12, here of n-type conductivity semiconductor material and having a doping concentration in the range of about $1-5 \times 10^{15}$ cm$^{-3}$ and a thickness between about 3-20 microns is formed on the substrate 10 and serves as a semiconductor body in which the MOS transistor is formed. The substrate 10 and epitaxial layer 12 meet at an interface 11, and a buried layer 13, here of p-type semiconductor material having a thickness of between 1-5 microns and a doping level of about $10^{14}-10^{15}$ cm$^{-3}$ is provided at the interface 11. Typically, the doping level of the buried layer 13 will be about 5-10 times higher than that of the substrate 10.

In this lateral MOS device, the source, channel and drain regions are all formed in the epitaxial layer 12 and adjoining a major surface 15 thereof. A surface-adjoining source region 14, here of n+conductivity type and having a doping concentration of about $10^{19}-10^{20}$ cm$^{-3}$ and a thickness of about 0.1-1 micron is shown in the upper left-hand region of the device, with a channel region 16 of p-type conductivity material and having a doping concentration of about $10^{16}-10^{17}$ cm$^{-3}$ and a thickness of between about 1-2 microns is shown adjacent the source region 14. In operation, a conductive channel is formed in a surface-adjacent portion 18 of the channel region. A surface-adjoining drain region 20 is provided in the right-hand side of the device, as shown in FIG. 1, having the same conductivity type, doping concentration and thickness as that of the source region 14. A drift region 21 is located in that portion of the epitaxial layer 12 between the channel region 16 and the drain region 20.

An insulating layer 22, which may be of silicon oxide or other suitable insulating material, is provided on major surface 15 and extends from above the source region 14 to above the drain region 20 in the embodiment shown in FIG. 1. A polysilicon gate 23 is provided on the insulating layer 22 and over the channel 18, and has a gate electrode 24 connected thereto to provide an external electrical connection. Source electrode 26 and drain electrode 28 provide electrical connections, respectively, to the source and drain regions of the transistor.

The structure of the prior art device shown in FIG. 1 is completed by a semi-insulating field plate 30 which is located adjacent to major surface 15, over drift region 21 and which extends laterally from drain electrode 28 to gate electrode 24. In the embodiment shown, the field plate is connected at one end to the drain electrode, and at the other end to the gate electrode. The field plate is composed of a suitable semi-insulating material, such as polycrystalline silicon (sometimes referred to as SIPOS or semi-insulating polycrystalline silicon), silicon-rich oxide or other suitable material having a resistivity in the range of about $10^8-10^{12}$ ohm.cm and a thickness of about 2,000-5,000 angstroms. The field plate may either be provided on insulating layer 22 (as shown), which insulating layer can typically be up to 1 micron thick, or else the insulating layer 22 beneath the field plate can be eliminated, and the field plate provided directly on major surface 15.

Devices of the general type shown in FIG. 1 are well known in the art, and hence will not be described in further detail. It should be noted however, that the present invention can be applied not only to the illustrated device but to a wide range of field-plate MOS transistors of the general type described.

Figure 2:
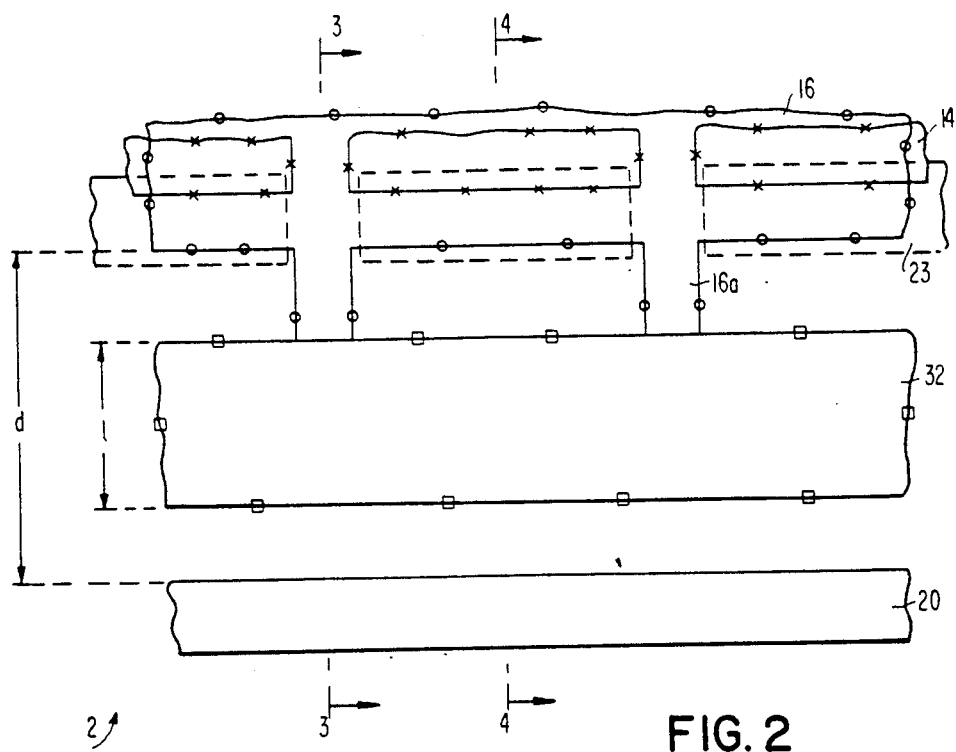
FIG. 2 is a partial top view of a lateral MOS transistor of the same general type as that shown in FIG. 1 and having a surface-adjoining top layer in accordance with the invention.

The improvement of the invention is shown in partial top view in FIG. 2, with two different embodiments shown in FIGS. 3A, 4A and 3B, 4B respectively. It will be recognized that large portions of the devices shown in FIGS. 2, 3 and 4 are similar to the corresponding portions of the device already described, and these portions will accordingly not be further described.

Figure 3A:
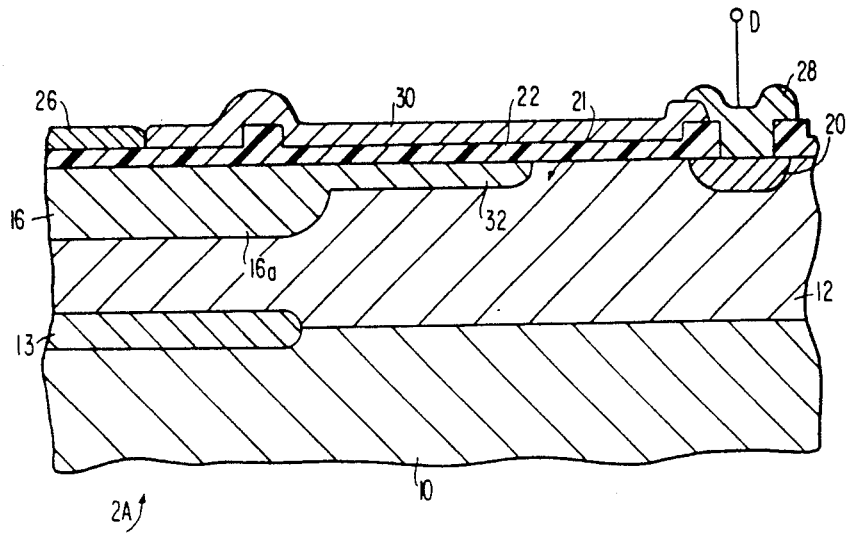
FIGS. 3A and 3B are cross-sectional views along the line 3—3 in FIG. 2 and showing two alternate field-plate configurations.
Figure 3B:
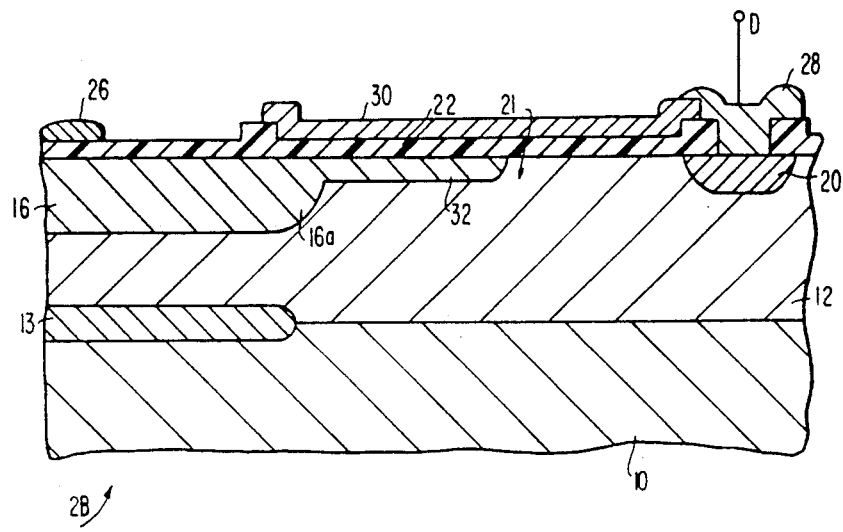

The improved performance of devices in accordance with the present invention is achieved primarily by providing a surface-adjoining top layer 32 in drift region 21 between the channel region 16 and the drain region 20. This top layer is of the same conductivity type as that of the channel region, here p-type, and has a net charge doping in the range of about $1-3 \times 10^{12}$ cm$^{-2}$ and a typical thickness of about 0.5-2.0 microns. The top layer is connected to channel region 16 at selected locations by channel extension regions 16a, as shown in FIGS. 2, 3A and 3B.

Figure 4A:
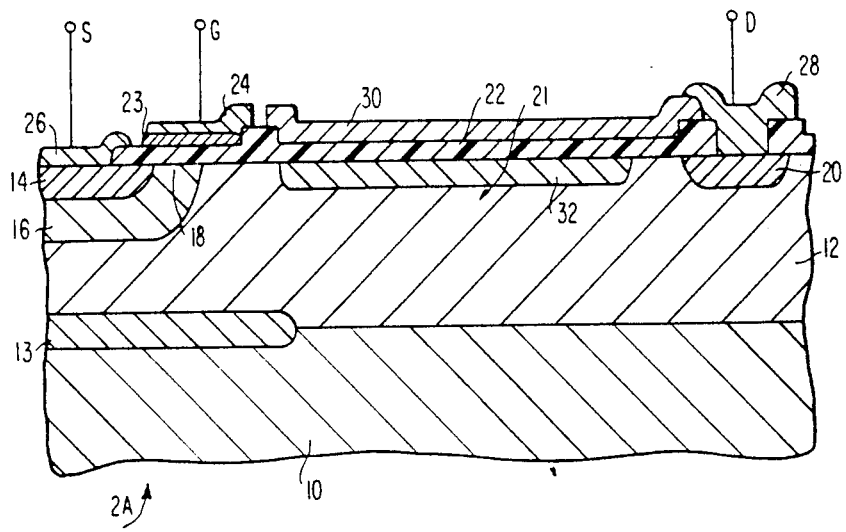
FIGS. 4A and 4B are cross-sectional views along the line 4—4 in FIG. 2 and showing two alternate field-plate configurations.
Figure 4B:
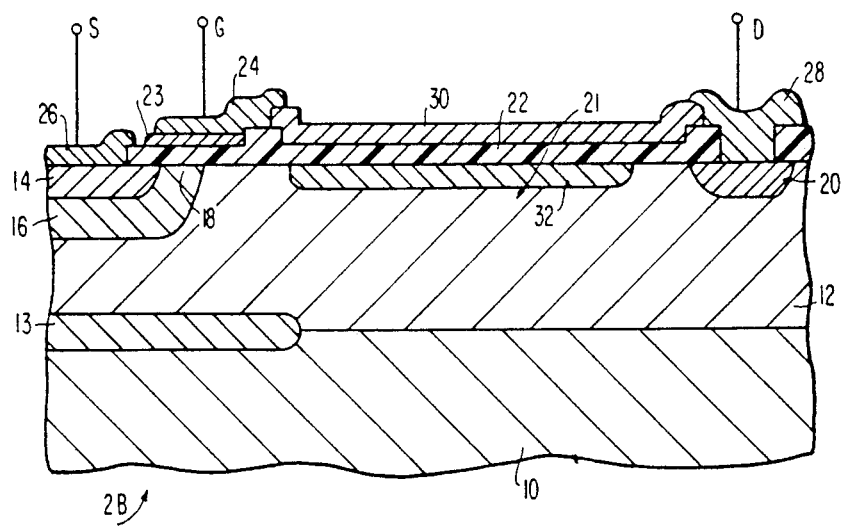

In FIG. 2, a partial top view of an MOS transistor 2 in accordance with the invention, as so far described, is shown. In this Figure, the channel extension regions 16a between the channel region 16 and the top layer 32 can be clearly seen. In the cross-sectional views 3A, 4A and 3B, 4B, two alternate connection schemes for the field plate 30 (not shown in FIG. 2 for clarity) are depicted. In the embodiment shown in FIGS. 3A and 4A, the left end of field plate 30 in transistor 2A is connected directly to source electrode 26, as shown in FIG. 3A, and no electrical connection is made between field plate 30 and gate electrode 24, as shown in FIG. 4A. In the alternative embodiment of transistor 2B shown in FIGS. 3B and 4B, on the other hand, an electrical connection is made between field plate 30 and gate electrode 24, as shown in FIG. 4B, while the field plate is not electrically connected to source electrode 26, as shown in FIG. 3B. The lateral extent "l" of the top layer 32 is not critical, but this distance, shown in FIG. 2, should advantageously be at least 40%, but less than 100%, of the total lateral distance "d" between the channel region and the drain region. In a preferred embodiment of the invention, the lateral distance "l" will be between about 80% and 98% of the lateral distance "d".

As described above, the provision of top layer 32, in accordance with the present invention, permits MOS transistors having a field plate structure to be used in switching circuits, an application for which this class of devices was previously unsuited due to the very slow transient on-resistance change during turn-on. By utilizing a top layer in accordance with the present invention, it is possible to achieve the advantages associated with field-plate devices while at the same time achieving suitable switching performance.

Finally, while the invention has been particularly shown and described with reference to certain preferred embodiments thereof, it will be understood by those skilled in the art that various changes in form and detail may be made without departing from the spirit and scope of the invention.

What is claimed is:

1. An MOS transistor comprising a semiconductor body of a first conductivity type and having a major surface, a surface-adjoining source region of said first conductivity type in said body, a surface-adjoining channel region of a second conductivity type opposite to that of said first type in said body and adjacent said source region, a surface-adjoining drain region of said first conductivity type in said body and spaced apart from said channel region, a drift region formed from a portion of said body between said channel region and said drain region, an insulating layer on said surface and covering at least that portion of the channel region located between said source region and said drain region, a gate electrode on said insulating layer and over said portion of the channel region, source and drain electrodes connected respectively to the source and drain regions of said transistor, and a semi-insulating field plate adjacent said surface, over said drift region and extending laterally in a first direction from said drain electrode toward said gate and source electrodes, said field plate being connected at a first end to said drain electrode and at a second opposite end to only one of said gate and source electrodes, characterized in that a surface-adjoining top layer of said second conductivity type is provided in said drift region between said channel region and said drain region, and in that said top layer is spaced apart from said drain region and is connected only at selected locations to said channel region, said selected locations being spaced apart in a second direction perpendicular to said first direction.

2. An MOS transistor as in claim 1, wherein the second end of said field plate is connected to said gate electrode.

3. An MOS transistor as in claim 1, wherein the second end of said field plate is connected to said source electrode.

4. An MOS transistor as in claim 1, 2 or 3, wherein said semiconductor body comprises a substrate of said second conductivity type and an epitaxial layer of said first conductivity type on said substrate and comprising said major surface.

5. An MOS transistor as in claim 4, further comprising a buried layer of said second conductivity type located at the intersection of said substrate and said epitaxial layer, and beneath said source and channel regions.

6. An MOS transistor as in claim 4, wherein said top layer has a net charge doping of between about $1 \times 10^{12}$ and $3 \times 10^{12}$ cm$^{-2}$ and a thickness of between about 0.5 and 2.0 $\mu$m, and occupies at least 40% but less than 100% of the total lateral distance between said channel region and said drain region.

7. An MOS transistor as in claim 6, wherein said top layer occupies between about 80% and 98% of the lateral distance between said channel region and said drain region.

8. An MOS transistor as in claim 1, 2 or 3, wherein said field plate is formed directly on said major surface.

9. An MOS transistor as in claim 1, 2 or 3, wherein said insulating layer on said surface extends from said source region to said drain region and said field plate is formed on said insulating layer.

10. An MOS transistor as in claim 1, wherein said source region comprises segments spaced apart in said second direction, and said top layer is connected to said channel region only at selected locations which are positioned, in said second direction, inbetween said source region segments.

* * * * *